US012803315B2

(12) United States Patent
Shen et al.

(10) Patent No.: US 12,803,315 B2
(45) Date of Patent: Nov. 17, 2026

(54) METHOD FOR RECONDITIONING NiMH BATTERY CELLS

(71) Applicant: Nilar International AB, Täby (SE)

(72) Inventors: Yang Shen, Gävle (SE); Stina Starborg, Sollentuna (SE)

(73) Assignee: Nilar International AB, Täby (SE)

( * ) Notice: Subject to any disclaimer, the term of this patent is extended or adjusted under 35 U.S.C. 154(b) by 1079 days.

(21) Appl. No.: 17/907,907

(22) PCT Filed: Mar. 25, 2021

(86) PCT No.: PCT/SE2021/050263
§ 371 (c)(1),
(2) Date: Aug. 29, 2022

(87) PCT Pub. No.: WO2021/201749
PCT Pub. Date: Oct. 7, 2021

(65) Prior Publication Data

US 2023/0102119 A1 Mar. 30, 2023

(30) Foreign Application Priority Data

Mar. 31, 2020 (SE) .................................... 2050361-1

(51) Int. Cl.
*H02J 7/00* (2006.01)
*G01R 31/389* (2019.01)
(Continued)

(52) U.S. Cl.
CPC ............ *H02J 7/875* (2026.01); *G01R 31/389* (2019.01); *G01R 31/392* (2019.01);
(Continued)

(58) Field of Classification Search
CPC ............. H01M 4/244; H01M 8/04783; H01M 8/0267; H01M 10/4242; H01M 10/526; G01R 31/392; G01R 31/389; H02J 7/875
See application file for complete search history.

(56) References Cited

U.S. PATENT DOCUMENTS 7,354,668 B2 * 4/2008 Orihashi ............. H01M 8/0267 429/432
9,991,529 B2 * 6/2018 Hasegawa ......... H01M 8/04783
(Continued)

FOREIGN PATENT DOCUMENTS

JP 4273781 B2 * 6/2009 ........ H01M 8/04246
WO 2007093626 A1 8/2007
(Continued)

OTHER PUBLICATIONS

Yang Shen et al., "Increasing NiMH battery cycle life with oxygen," International Journal of Hydrogen Energy, Mar. 29, 2018, vol. 43, No. 40, p. 18626-18631.

*Primary Examiner* — Lam S Nguyen
(74) *Attorney, Agent, or Firm* — Capitol City TechLaw

(57) ABSTRACT

The present invention relates to a method for reconditioning of a battery module (1). The battery module (1) comprises two or more battery cells (2), and has a casing (4) encompassing the battery cells and enclosing a common gas space (5). The method comprises the steps of: obtaining data relating to the number of cells of the battery module and voltage over the battery cells; obtaining (102) an indicative parameter related to an internal resistance (Ri) of at least one of the battery cells; determining (104) based on the indicative parameter and the data on the battery module, determining (105*a*) whether the voltage indication over the at least one of the battery cells is range of voltage indication threshold (Ut0-Ut1), a filling amount of oxygen to be filled into the battery module; and filling (107) the amount of
(Continued)

oxygen into the battery module in order to reduce the indicative parameter to a level below the first threshold value.

15 Claims, 5 Drawing Sheets

(51) Int. Cl.
*G01R 31/392* (2019.01)
*H01M 10/42* (2006.01)
*H01M 10/48* (2006.01)
*H01M 10/30* (2006.01)

(52) U.S. Cl.
CPC ..... *H01M 10/4242* (2013.01); *H01M 10/484* (2013.01); *H01M 10/486* (2013.01); *H01M 10/30* (2013.01)

(56) References Cited

U.S. PATENT DOCUMENTS

| | | | | |
|---|---|---|---|---|
| 2004/0151956 | A1* | 8/2004 | Orihashi | H01M 8/241 429/432 |
| 2017/0158076 | A1 | 6/2017 | Kohlberger | |
| 2019/0058225 | A1* | 2/2019 | Noréus | H01M 4/244 |

FOREIGN PATENT DOCUMENTS

| | | | | |
|---|---|---|---|---|
| WO | WO-2009118649 | A1 * | 10/2009 | H01M 8/04529 |
| WO | 2017069691 | A1 | 4/2017 | |
| WO | 2018111182 | A1 | 6/2018 | |

* cited by examiner

METHOD FOR RECONDITIONING NiMH BATTERY CELLS

This application claims priority under 35 USC 119(a)-(d) from SE patent application No. 2050361-1 filed Mar. 31, 2020, the entire content of which is incorporated herein by reference.

TECHNICAL FIELD

The present invention relates generally to the field of reconditioning battery cells, especially metal hydride battery cells. The method relates to a battery module where oxygen gas, and optionally hydrogen gas, is added to improve performance. Further, the present invention relates specifically to the field of increasing the life time of the battery module.

BACKGROUND ART

Nickel metal hydride (NiMH) batteries have long cycle life and have rapid charge and discharge capabilities. During charge and discharge the electrodes interact with each other through the alkaline electrolyte as hydrogen is transported in the form of water molecules between the electrodes. During discharge hydrogen is released from the negative electrode and is allowed to migrate to the positive electrode (nickel electrode) where it intercalates. This binding result in energy is released. During charging the hydrogen migration is reversed.

Especially NiMH batteries are designed to be nickel electrode limited with a starved electrolyte. This is done in order to be able to avoid over charge and over discharge states of the battery cells by controlling the battery cell chemistry and state-of-charge via the gas phase.

When the battery cell is charged, hydrogen is transported from the nickel hydroxide to the metal hydride by water molecules in the aqueous alkaline electrolyte. During discharge hydrogen is transported back to the nickel hydroxide electrode, again in the form of water molecules.

The PCT publication WO 2017/069691 describes that a proper balance of the nickel electrode capacity with respect to the metal hydride electrode capacity with suitable amounts of both overcharge- and over discharge-reserves are essential for a well-functioning battery module, enabling it to reach a stable long time charge/discharge performance. Adding oxygen gas, hydrogen gas or hydrogen peroxide provides a suitable overcharge and discharge reserve and replenishes the electrolyte, which prolongs the lifetime of the battery module and increases the number of possible cycles.

The adding of oxygen is preferably performed when the battery module is not in operation. Thus, in order to optimize the operation of the battery module, filling of oxygen should preferably be done in a way that optimizes not only the capacity of the battery module but also the operating time.

In an article with the title "Increasing NiMH Battery Cycle Life with Oxygen" by Shen Yang et al, published in International Journal of Hydrogen Energy, 2018-03-29, ISSN 0360-3199, Vol 43, No 40, pp 18626-18631, a study is disclosed wherein a controlled addition of oxygen was used to rebalance the electrodes and replenish the electrolyte in a NiMH battery.

SUMMARY OF THE INVENTION

An objective of the present invention is to provide a method for reconditioning, by adding oxygen, a battery module comprising two or more battery cells, preferably nickel metal hydride, NiMH, battery cells, which at least alleviates the drawbacks of the prior art.

At least one of these objectives is fulfilled with a method according to claim 1.

Further advantages of the invention are provided with the features of the dependent claims.

According to a first aspect of the present invention a method is provided for reconditioning of a battery module comprising two or more battery cells. The battery module has a casing encompassing the battery cells and enclosing a common gas space. Each battery cell in the battery module comprises a first electrode, a second electrode, a porous separator, and an aqueous alkaline electrolyte arranged between the first electrode and the second electrode. The porous separator, the first electrode and the second electrode are configured to allow exchange of hydrogen and oxygen by allowing gas to migrate between the electrodes. The casing further comprises an inlet for adding a gas or a liquid to the common gas space of the casing. The method is characterized in that the method comprises the steps of obtaining data on the battery module, wherein the data relates to at least the number of battery cells of the battery module and the energy capacity of the battery module. The method also comprises the steps of obtaining data on an indicative parameter related to the internal resistance of at least one of the battery cells, and determining, in case the indicative parameter exceeds a predetermined first threshold value, based on the indicative parameter and the data on the battery module, a filling amount of oxygen to be filled into the battery module in order to reduce the indicative parameter to a level below the first threshold value. The method also comprises, in case it is determined to be safe, the step of initiating filling of the battery module with the determined filling amount of oxygen. The initiation may comprise the step of placing an order for a gas container with the correct filling amount of oxygen at the correct pressure to be sent to the battery module. Alternatively, in case the battery module is connected to an oxygen pipe, the initiation may comprise the initiation of filling of oxygen from the oxygen pipe.

By the method according to the first aspect of the present invention the operation of the battery may be optimized. The method enables optimization not only of the battery module capacity but also the operating time of the battery module. A proper level of the first threshold value enables filling of oxygen at the optimum level to avoid running the battery with a high internal resistance while simultaneously avoiding a too short time between fillings.

The method is implemented on a control circuitry, which may comprise a computer.

The step of obtaining data on the indicative parameter of at least two of the battery cells is preferably implemented by receiving data from a measuring unit configured to obtain the values needed to determine the indicative parameter of the battery module. The number of cells in the determination is governed by practical limitations. Usually, it is only possible to get access to the terminal contacts of a battery module. Thus, the indicative parameter, e.g. SOH or internal resistance, are determined for all battery cells in the battery module.

The step of obtaining data on the battery module, which data relates to at least the number of battery cells of the battery module, the energy capacity of the battery module and optionally the volume of the common gas space, may be done in many different ways. One alternative is to have the measuring unit configured to send data on the battery module to the control unit which performs the method. The data may be sent from the measuring unit, but in order to minimize the complexity of the measuring unit it is preferably that the measuring unit only sends an identification number. On receipt of the identification number from the measuring unit the computer may obtain the data from a memory. As stated above the data relates to at least the number of battery cells of the battery module, the energy capacity of the battery module and optionally the volume of the common gas space. This data is necessary to be able to determine the filling amount of oxygen to be filled into the battery module. It is, however, not necessary to use the actual number of battery cells of the battery module, the energy capacity of the battery module and the volume of the common gas space in the determination. According to one alternative the control unit may consult a look-up table in a memory to retrieve the data on the battery corresponding to the identification number of the battery module. The data on the battery may in one example be a type number identifying the type of battery. The control unit may then retrieve from a different look-up table the necessary filling amount of oxygen based on the obtained indicative parameter and the type number. The necessary filling amount of oxygen in the look-up table may in turn be based on earlier experiments with a similar battery type. The type number defines a battery module with a predetermined number of battery cells, a predetermined energy capacity and optionally a predetermined volume of the common gas space.

Preferably, in case the obtained indicative parameter is the internal resistance which refers to the internal resistance over a plurality of battery cells, an average internal resistance per cell is calculated. In this way the same first threshold value may be used for all possible different battery types with different number of battery cells.

The method may comprise the steps of obtaining a voltage indication of said at least two of the battery cells, determining whether the voltage indication of said at least two of the battery cells is within a predetermined voltage interval, and determining that it is safe to fill oxygen into the battery module only if the obtained voltage indication of said at least two battery cells does not have a value outside the predetermined voltage interval.

The predetermined voltage interval is defined by a lower voltage indication threshold and an upper voltage indication threshold, and the voltage indication may be the open circuit voltage, OCV, over the battery module or the state of charge, SOC, for the battery module.

It is advantageous to prevent filling of oxygen to reduce the risk of fire if a battery module is filled with oxygen when the voltage indication over the battery module is within the predetermined voltage interval. When the open circuit voltage is used as voltage indication, it is preferred that an average voltage per cell is calculated from the open circuit voltage over said at least two battery cells. In that way only one voltage indication threshold has to be used.

The method may also comprise, in case it is determined not to be safe to fill the battery module with oxygen, the steps of initiating discharging or charging the battery module to a voltage for each battery cell within the voltage interval before initiating filling of the battery module with the determined filling amount of oxygen. The initiation of discharging or charging may according to one alternative be to send a message to an operator of the battery to discharge or charge the battery. Alternatively, if the battery module is connected for automatized discharging or charging, the initiation may comprise the step of starting the automatized discharging or charging.

The filling of the battery module with an inert gas may be initiated in conjunction with, or at the same time as, the initiation of filling of the battery module with oxygen. By filling with a combination of oxygen and an inert gas the fire hazard is minimized further. In case the battery module is connected to a gas pipe, the gas pipe preferably contains the correct gas mixture of oxygen and inert gas.

The method may also comprise the steps of, after initiation of filling of the battery module with oxygen, obtaining an after filling parameter related to internal resistance after filling of said one of the at least two battery cells; determining whether the after filling parameter exceeds a predetermined second threshold value; and determining, in case the after filling parameter exceeds the predetermined second threshold value, based on the after filling parameter and the data on the battery module, the additional filling amount of oxygen to be filled into the battery module in order to reduce the after filling parameter below the second threshold value, and initiating filling of the battery module with the determined additional filling amount of oxygen.

These steps ensure that enough oxygen has been added to the battery module to ensure optimum functionality and operation in the future. The second threshold value is lower than the first threshold value. By aiming at such a second threshold value the number of cycles, until the internal resistance increases and affects the performance of the battery module, becomes higher.

The method may also comprise, the step of initiating the preparation of a container with the determined filling amount of oxygen for filling the battery module with the determined filling amount of oxygen to reduce the indicative parameter of the battery module. The pressure of the gas in the container depends on the volume of the container and the amount of gas in the container. For a small container the container amount is approximately the same as the filling amount of oxygen. However, after filling of oxygen from a container a residual amount of oxygen will always remain in the container. The flow of gas from the container to the battery module will continue until the pressure in the container is the same as the pressure in the common gas space of the battery module.

According to a second aspect of the invention a computer program is provided for reconditioning a battery module, comprising instructions which, when executed on at least one processor, cause the at least one processor to carry out the method according to the first aspect of the invention.

According to a third aspect of the invention a computer-readable storage medium is provided, which carries a computer program for reconditioning a battery module according to the second aspect of the invention.

According to a fourth aspect, a system for reconditioning a battery module is provided comprising a control circuitry configured to perform the method according to the first aspect.

The system may comprise a measuring unit configured to obtain the resistance by measuring the voltage over the battery module and the applied or withdrawn current, and is configured to communicate with the control circuitry. The control circuitry may comprise a local control unit configured to obtain at least the internal resistance from the measured values of at least one of the battery cells and to control the filling of oxygen into the battery module; and a control unit, which is in communication with the local control unit. The control unit is configured to obtain data on the battery module from a memory and to determine the filling amount of oxygen based on the measured values used to calculate the internal resistance obtained from the local control unit and the data on the battery module.

In the following preferred embodiments of the invention will be described with reference to the drawings.

DETAILED DESCRIPTION

Figure 1:
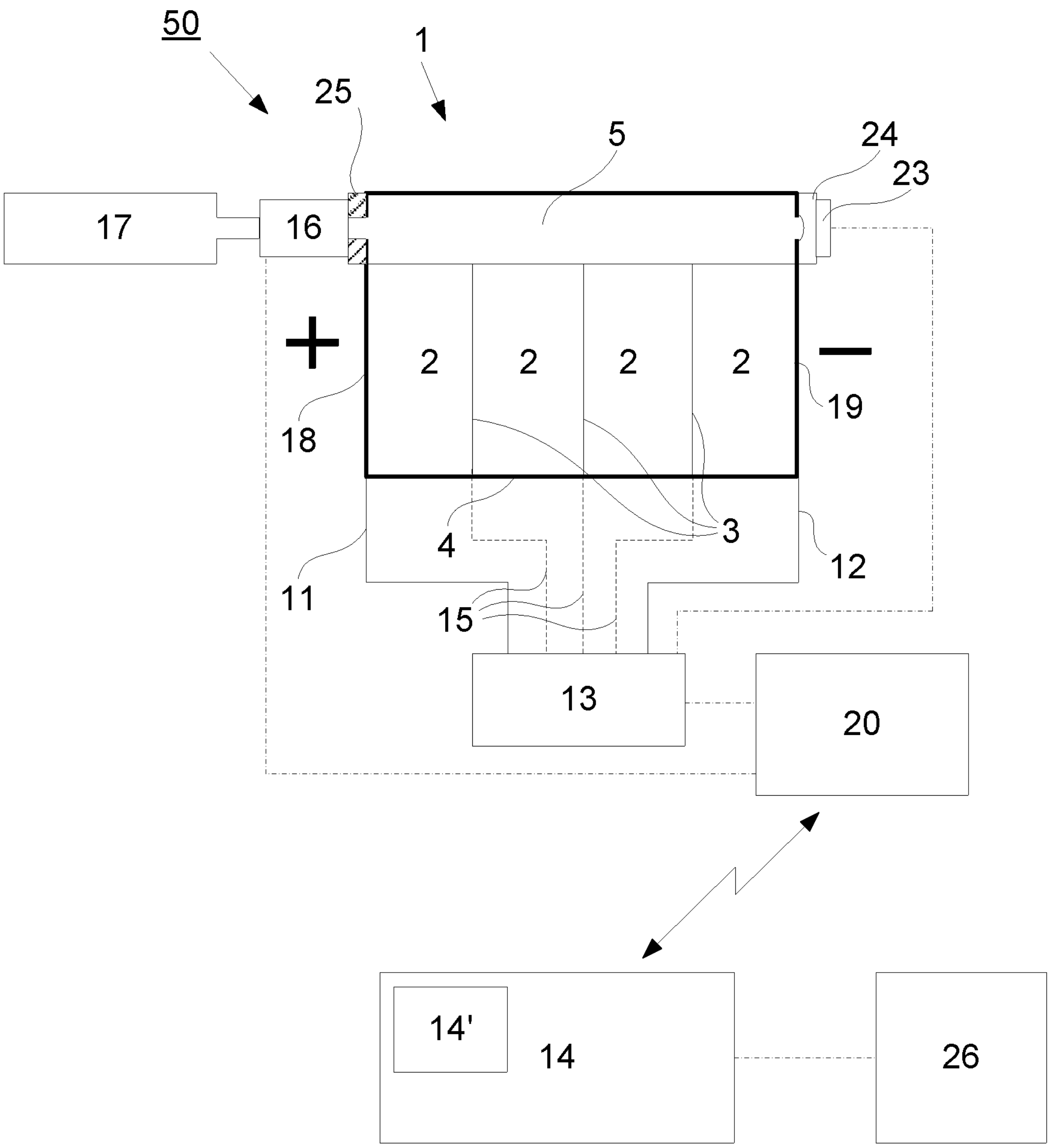
FIG. 1 shows a battery system for reconditioning battery cells in a battery module.

In the following description of preferred embodiments reference will be made to the drawings. The drawings are not drawn to scale and some dimensions may be exaggerated in order to clearly show all features. The same reference numeral will be used for similar features in the different drawings.

The terminology used herein is for the purpose of describing particular aspects of the disclosure only, and is not intended to limit the invention. As used herein, the singular forms “a”, “an” and “the” are intended to include the plural forms as well, unless the context clearly indicates otherwise.

In the application, the term indicative parameter related to the internal resistance of the battery module, comprises the internal resistance as well as a state of health, SOH, measure of the battery module. The SOH measure may include the internal resistance and other parameters that are important to determine the condition of the battery module, such as the internal gas pressure.

The term “internal resistance”, which should be interpreted as the internal DC resistance, is commonly used in the description as a measure of the status of each battery module, and thus the battery cells. The internal resistance is obtained by measuring the voltage drop during a controlled discharge using a predetermined discharge current. The internal resistance is thereafter calculated based on the measured voltage drop and the discharge current. An example is found in the following standard IEC 63115-1, Ed. 1.0 (2020-01), chapter 7.6.3 Measurement of the internal DC resistance.

Some of the example embodiments presented herein are directed towards a method for reconditioning battery cells, especially battery cells having a metal hydride, MH, electrode. An example of such a battery cell is a NiMH battery cell. As part of the development of the example embodiments presented herein, a problem will first be identified and discussed.

During charge and discharge of a NiMH battery module comprising multiple battery cells, the performance of each battery cell will deteriorate due to electrolyte dry out. It has been found that the addition of gas restores the electrode balance resulting in that the internal gas pressure decreases since the gas recombination is improved. Thus, the battery module becomes less sensitive to unintentional overcharging and over discharging. The starved electrolyte design means that only a minimal amount of electrolyte is available in the battery module. Any loss of electrolyte will impair performance mainly manifested in an increased internal resistance. Electrolyte dry-out is the main cause for limiting the cycle life. The electrolyte dry-out is mainly caused by either excessive internal battery cell pressure, which may open the safety valve releasing either oxygen or hydrogen gas dependent upon abusive overcharge or over discharge. When two or more battery cells are gaseously connected, the battery cells will lose electrolyte unevenly. This may be extended to be valid also for battery modules sharing a common gas space.

The main reason for this is that the battery cells are unevenly charged since they are not 100% identical. This will cause some cells to heat up before others, and water (in the form of gas) migrates between the gaseously connected battery cells and condensate where it is less warm. Thus water move within battery modules. Thus, one of the battery cells will exhibit a faster increase in internal resistance compared to other battery cells. The increase in internal resistance may lead to a decreased lifetime of the battery module.

FIG. 1 shows a battery system 50 for conditioning a battery module 1 comprising battery cells 2, which are series connected with biplates 3, to form a stack of battery cells. The battery module 1 has a casing 4 containing the battery cells and enclosing a common gas space 5. Each battery cell 2 in the battery module 1 comprises a first positive electrode, a second negative electrode, a porous separator, and an aqueous alkaline electrolyte arranged between the first electrode and the second electrode. The separator, the first electrode and the second electrodes are configured to allow exchange of hydrogen and oxygen by allowing gas to migrate between the two electrodes. The battery module 1 comprises a positive endplate 18 and a negative endplate 19, which are in contact with the respective end of the stack of battery cells 2. The battery module 1 also comprises a positive terminal connector 11, which is connected to the positive endplate 18, and a negative terminal connector 12, which is connected to the negative endplate 19. The battery casing further comprises a gas inlet 25 for adding a gas or a liquid to the common gas space 5 of the casing 4. The positive terminal connector 11 and the negative terminal connector 12 constitutes terminals from which electric power may be drawn from the battery module 1. Also shown in FIG. 1 is a measuring unit 13, which is connected to the positive terminal connector 11 and to the negative terminal connector 12, and which is configured to obtain data necessary to calculate an indicative parameter related to the internal resistance of the battery module 1 between the positive terminal connector 11 and the negative terminal connector 12. The data obtained by the measuring unit 13 may comprise voltage drop during discharge to determine the internal resistance, temperature, internal pressure, and current in case a current sensor is included within the measuring unit 13. The measuring unit 13 may also be configured to measure the open circuit voltage, OCV, between the positive terminal connector 11 and the negative terminal connector 12. As an alternative it would be possible to connect the measuring unit 13 to obtain the data for only one battery cell 2 as is indicated by the dashed lines 15. However, is very costly to manufacture a battery module with this functionality. An inlet valve 16 is connected to the gas inlet 25. In FIG. 1 an optional gas container 17 is connected to the inlet valve 16. A local control unit 20 is connected to the measuring unit 13 and to the inlet valve 16, and the local control unit may be configured to calculate the indicative parameter based on the data provided from the measuring unit 13. A safety valve 24, e.g. a bursting disc, is connected to the common space 5. The safety valve 24 prevents dangerous gas pressures to build up in the common gas space 5. A pressure sensor 23 may also be connected to the common gas space 5 and is configured to measure the internal pressure in the common gas space 5. An example of a standalone NiMH battery module is disclosed in WO 2007/093626 assigned to the present applicant.

In FIG. 1 is also shown a local control unit 20, which is connected to the pressure sensor 23, the inlet valve 16 and to the measuring unit 13. The local control unit 20 is in communication with a control unit 14, preferably wirelessly connected. It is of course possible to have the local control unit 20 connected to the control unit 14 by wire. It is also possible to have one or more intermediate units in between the local control unit 20 and the control unit 14. It is also possible to omit the local control unit and have the control unit 14 connected to the inlet valve 16 and to the measuring unit 13. The control unit 14 may be located at a remote location such as at, e.g., the battery module manufacturer. The central control unit 14 is connected to or comprises a memory 26.

The control unit 14 is configured to initiate measurements with the measuring unit 13, at predetermined intervals, of temperature, pressure, voltages and currents needed to calculate the indicative parameters, such as internal resistance between the positive terminal connector 11 and the negative terminal connector 12, of the battery module and to send this information to the control unit 14 together with information identifying the battery module 1. To this end the control unit 14 sends a request to the local control unit 20, which returns as answer the current indicative parameter and the open circuit voltage over the battery module. The internal resistance is not directly measured by the measuring unit 13. The measuring unit 13 measures the voltage drop over the battery modules 1 during a discharge with a predetermined discharge current and then the internal resistance is calculated.

During use of the battery module 1, the battery module is discharged and charged. The internal resistance of the battery module increases for an increasing number of charges and discharges.

Although FIG. 1 illustrates a battery module 1 with battery cells in a bipolar configuration, the invention should not be limited to bipolar configurations. Battery cells arranged in other types of configuration, such as cylindrical configuration or prismatic configuration, may benefit from the invention provided a common gas space is provided for a plurality of battery cells in the battery module.

Figure 2:
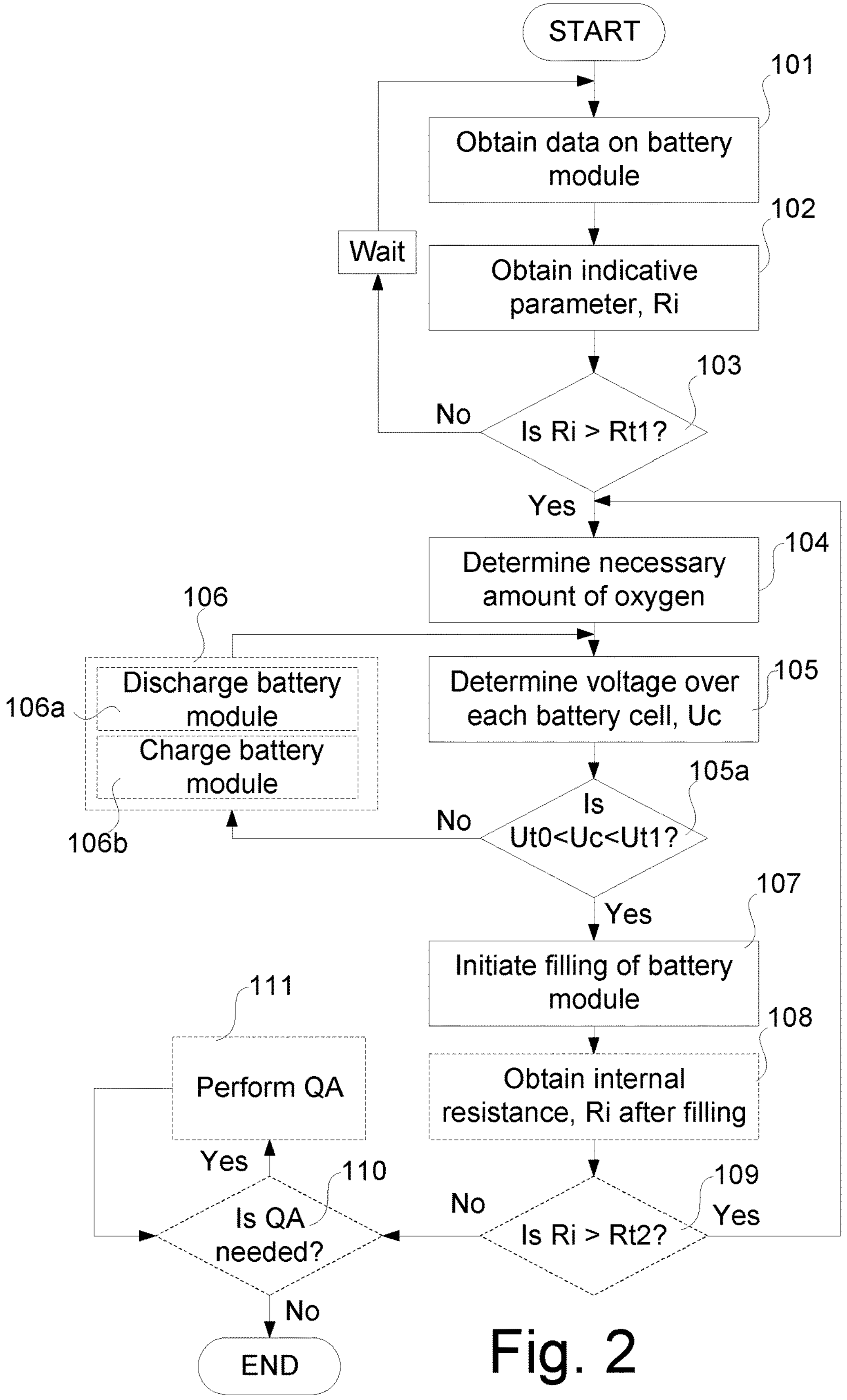
FIG. 2 shows a flow diagram over a method, according to an embodiment, for reconditioning battery cells in the battery module.

FIG. 2 shows a flow diagram of a method for reconditioning the battery module 1. The method comprises the first step 101 of obtaining data on the battery module 1. This may be done in one of many different ways. An example on how the data may be obtained is that the local control unit 20 sends a unique identification number to the control unit 14. The control unit 14 may then retrieve data on the battery module from the memory 26. In a second step 102 the indicative parameter, here exemplified as the internal resistance of at least one of the battery cells 2, is obtained. According to one embodiment, data to calculate the internal resistance is obtained from the measuring unit 13, and a control circuitry (e.g. the local control unit 20) determines the internal resistance between the positive terminal connector 11 and the negative terminal connector 12. The internal resistance may in this case be determined as an average internal resistance per battery cell or as the total internal resistance over all battery cells of the battery module. According to an alternative embodiment, the measuring unit 13 obtains data to calculate the internal resistance over each battery cell (as indicated by dashed lines 15 in FIG. 1). The internal resistance will in this case be determined as the actual internal resistance per battery cell. In this example, the local control unit 20 then sends the result of the resistance determination to the control unit 14.

In a third step 103 the control unit 14 determines whether the internal resistance $R_i$ exceeds a predetermined first resistance threshold value $R_{t1}$, which first resistance threshold value $R_{t1}$ may be stored in the memory 26 or be implemented in the method, i.e. in a computer program controlling the execution of the method. In case the first resistance threshold $R_{t1}$ refers to a threshold for a single battery cell 2 the threshold might be included in the program. However, if the first resistance threshold $R_{t1}$ refers to a resistance threshold for a plurality of battery cells 2 it might be stored in the memory 26 together with the data on the battery module, and the data comprising the number of battery cells within the battery module and the capacity of each battery cell. In more detail, the control unit 14 receives an identification number from the local control unit 20 and retrieves data on the battery module from the memory 26. Optionally, this data comprises the volume of the common gas space 5. The control unit may then divide the obtained resistance with the number of battery cells 2 to arrive at an average internal resistance per battery cell 2. In case the average internal resistance $R_{ic}$ per battery cell 2 does not exceed the predetermined first resistance threshold value $R_{t1}$ the control unit 14 waits during a waiting time $T_W$ for the next resistance determination.

In case the average internal resistance $R_{ic}$ per battery cell 2 exceeds the predetermined first resistance threshold value $R_{t1}$, the control unit 14 determines in a fourth step 104 the amount of oxygen to be filled into the battery module 1, based on the obtained internal resistance $R_i$ and the data on the battery module 1, in order to reduce the internal resistance of the battery module 1 to a level below the first resistance threshold value $R_{t1}$, preferably to a level below a second predetermined value threshold $R_{t2}$ as indicated in step 109. The data used in the determination of the necessary amount of oxygen preferably comprises information on the capacity of each battery cell 2, and optionally the volume of the common gas space 5. The necessary amount of oxygen may be determined in many different ways.

According to one alternative embodiment the control unit 14 relies on earlier measurements to obtain the necessary amount of oxygen to be filled into the common space 5 of the of the battery module 1. The control unit 14 may consult a look-up table in the memory 26 to retrieve the data on the battery corresponding to the identification number of the battery module. The data on the battery may in one example be a type number identifying the type of battery. The control unit 14 may then retrieve from a different look-up table the necessary amount of oxygen based on the determined internal resistance and the type number. The necessary amount of oxygen in the look-up table may in turn be based on earlier experiments with a similar battery type. It should be noted that data regarding the temperature of the battery module is important since the internal resistance varies as a function of temperature and in order to determine the correct amount of oxygen to be filled, the measured voltage drop during discharge needs to be normalized based on the temperature.

According to another alternative the control unit 14 obtains from the look-up table data necessary to calculate the amount of oxygen. The data in the look-up table may be the number of battery cells 2 in the battery module 1, the temperature and the number of battery cells 2, and optionally the volume of the common gas space 5 included when obtaining the internal resistance.

The method may also comprise an optional fifth step 105 of determining a voltage indication over each battery cell $U_c$. The voltage indication may be an open circuit voltage, OCV, over the battery module at the measured temperature or a state of charge, SOC, measure indicating the that it is safe to add oxygen to the battery module. In this example OCV will be used and the determination in step 105 is performed by measuring the open circuit voltage over the battery module, Urn, having a plurality of battery cells 2 and dividing the voltage over the battery module with the number of battery cells in the battery module obtained in step 101. Thereafter, it is determined whether the battery cell open circuit voltage, $U_c$, is within a predetermined voltage interval, $U_{t0}<U_c<U_{t1}$. Also, in this case it is necessary for the control unit 14 to have information on the number of battery cells 2 included in the voltage measurement. If it is determined in a sixth step 105*a* that the voltage is within the predetermined voltage interval, it is determined that it is safe to fill oxygen into the battery module 1, as indicated by a seventh step 107, which comprises filling of the battery module 1 with the determined amount of oxygen. On the other hand if the battery cell voltage is not within the voltage interval the optional step of adjusting, step 106, the battery cell voltage of the battery module is performed before repeating step 105. This means that if the battery cell voltage is higher or equal to an upper voltage indication threshold, $U_c \geq U_{t1}$, the battery module is discharged (step 106*a*). The discharge step may be performed either by actively discharge the battery module, or wait a certain time period to allow the battery module to self discharge. If the battery cell voltage is lower or equal to a lower voltage indication threshold $U_c \leq U_{t0}$, the battery module is charged (step 106*b*). It is advantageous to perform these optional steps, 105, 105*a* and 106, in order to reduce the risk for fire in case oxygen is filled into the battery module when the voltage is too high or too low, this may be caused by the fact that the oxygen recombination rate becomes too high at high voltages over the battery cells. If the battery cell voltage becomes too low the oxygen reacts directly with the negative electrode that is unprotected from intercalated hydrogen.

Figure 3A:
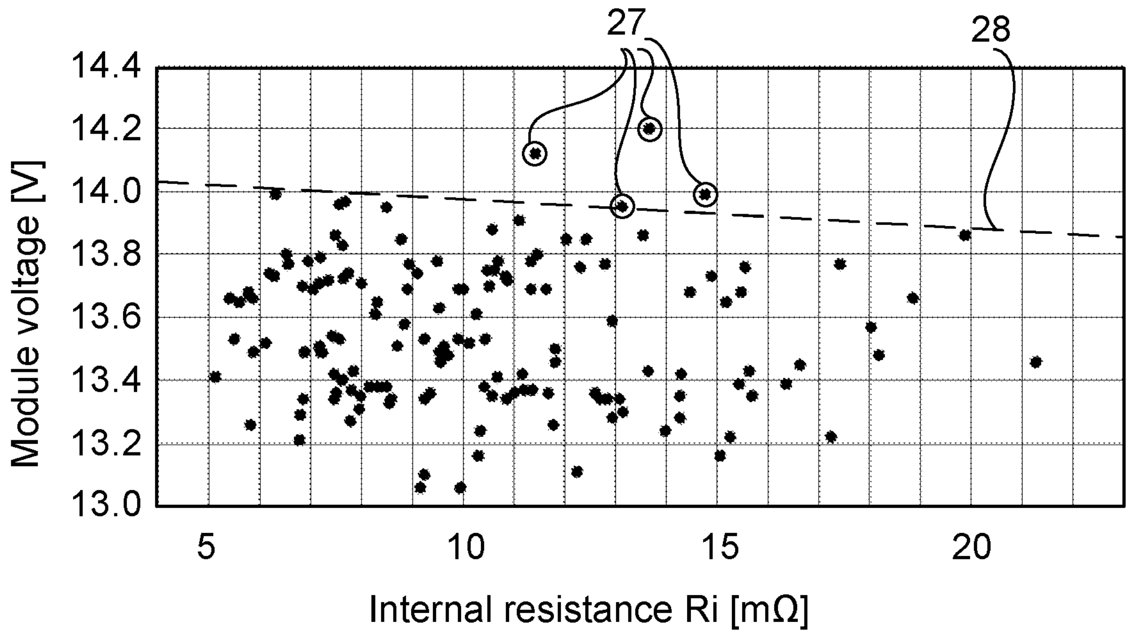
FIG. 3*a* shows a diagram in which different measurements of the battery cells resistance and the module voltage have been plotted for battery modules, both cycled and different battery modules.

FIG. 3*a* is a diagram over a plurality of measurements plotted for the resistance over a battery module at room temperature, i.e. +20° C.±2° C. and the corresponding open circuit voltage, OCV, over the battery module. The data in FIG. 3 is for battery modules with ten battery cells 2, and the y-axis is the combined voltage over all battery cells, i.e. 10 battery cells, and the x-axis is the average internal resistance for a battery cell. The voltage threshold for the battery cell, $U_t$, is a function of the resistance over the battery cell as is illustrated in FIG. 3*a*. The four encircled dots 27 indicate measurements for which the voltage is too high for filling oxygen. It should be noted that some of the data points in the diagram are from the same battery module that have been filled with oxygen many times, and some are from modules only filled a few times.

As mentioned above, in case it is determined not to be safe to fill the battery module with oxygen the method may comprise the optional intermediate step 106 of adjusting the battery cell voltage of the battery module to a battery cell voltage within the indicated voltage interval, before initiating filling of the battery module, step 107, with the determined amount of oxygen. As an example, the upper voltage indication threshold $U_{t1}$ is 1.39 V/cell and the lower voltage indication threshold $U_{t0}$ is 1.3 V/cell at a temperature of +20° C.±2° C. The upper voltage indication voltage threshold, as well as the lower indication voltage threshold, are temperature dependent and may be normalized to a predetermined temperature range (such as room temperature) in order to be able to ensure that the OCV is within the voltage interval 1.3-1.39 V/cell. Otherwise, threshold values for different temperatures needs to be available to determine that it is safe to fill the battery module with oxygen. Furthermore, the upper voltage indication threshold may vary as a function of measured internal resistance, as indicated by line 28 in FIG. 3*a*.

Figure 3B:
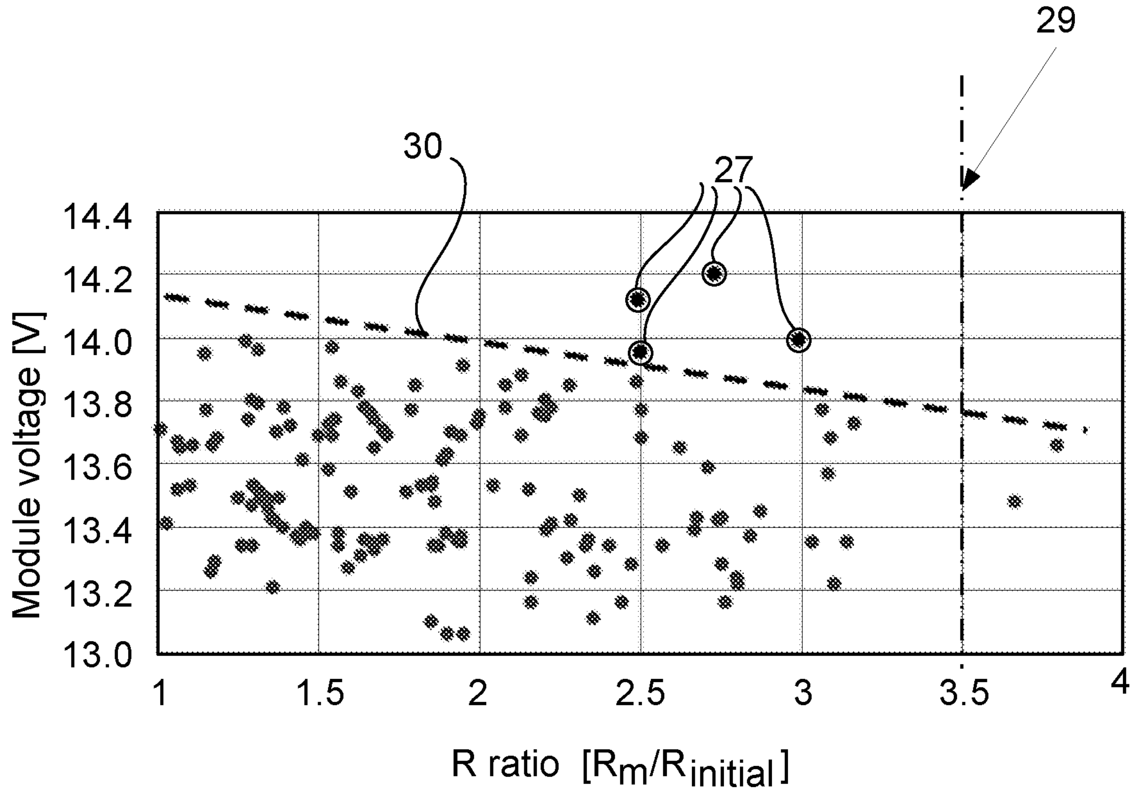
FIG. 3*b* shows a diagram presenting normalized measurements from FIG. 3*a* (resistance ratio) as a function of battery module voltage.

FIG. 3*b* is a graph containing the resistance measurements in FIG. 3*a* but normalized with the initial resistance value and presented as a resistance ratio called R ratio, i.e. $R_{measured}/R_{initial}$. It has been discovered that when the R ratio is too high, e.g. >3.5 as indicated by line 29, there are too much corrosion of the negative material in the battery cells which cannot be recovered by adding oxygen. It has also been discovered that optimum conditions for recondition the battery cells are achieved when the R ratio is in the range 1.5-2.0, since at a R ratio below 1.5 there are not enough hydrogen available for optimum electrolyte balancing since there are not enough overcharge reserve capacity (it has been consumed by hydrogen produced from corrosion), and oxygen may react with hydrogen from overdischarge reserve which may lead to unbalancing of electrodes and cause drop of capacity.

The upper voltage indication threshold $U_{t1}$ may be set to a fixed value, e.g. 1.39 V/cell or vary as a function of R ratio, as indicated by line 30 in FIG. 3*b*

In case SOC are used to determine if the battery module is safe to be filled with oxygen, the upper SOC threshold is 95% and the lower SOC threshold is 50%.

The battery module 1 may be filled with an inert gas, e.g. nitrogen, argon, helium, or air in conjunction with filling the battery module with oxygen, which reduces the risk of fire during filling. The addition of an inert gas may be performed sequential with filling of oxygen (before, after and/or interleaved with the filling of oxygen), or the inert gas may be introduced at the same time as oxygen in a mixture. In FIG. 1 a gas container 17 is shown connected to the gas inlet 25 via the inlet valve 16. The control unit 14 may be configured to initiate the filling by initiating the sending of the container 17 to the site of the battery module 1.

According to some embodiments, the step of initiating filling, step 107, of the battery pack may also comprise the step of adding hydrogen gas to the common gas space before filling the battery pack with oxygen, which further improves the operational efficiency of the battery module. However, this step can only be performed when the voltage indication is within the voltage indication interval, and the battery module is safe to be filled with oxygen.

As a measure of precaution, after initiating filling of the battery module with oxygen in the seventh step 107, the method optionally includes an eighth step 108, in which the control unit 14 obtains an after filling parameter related to the internal resistance after filling of said at least one battery cells 2 and determines, step 109, whether the after filling parameter, e.g. the internal resistance $R_i$ of each battery cell 2, exceeds a predetermined second threshold value, for instance a second resistance threshold value $R_{t2}$. If this is the case the method returns to step 104, wherein an additional amount of oxygen to be filled into the battery pack is determined in order to reduce the internal resistance to a level below the second resistance threshold $R_{t2}$. This amount is the amount of oxygen to be filled into the battery pack in step 107. The second resistance threshold $R_{t2}$ is preferably lower than the first resistance threshold $R_{t1}$. This provides a more robust method as it will allow more cycles of the battery before the internal resistance $R_i$ again exceeds the first resistance threshold $R_{t1}$. The optional feedback loop from step 109 to step 104 should in principle not be required, but in case it is necessary to fill any additional oxygen into the battery module, the battery module is filled with the determined amount of oxygen. In order for this step to be meaningful it is necessary that the filling of oxygen may be performed more or less instantly. In case a container 17 has to be sent for filling there might be a delay of hours to days until the battery module is filled with oxygen.

If the level of the average internal resistance, $R_i$ is less than the second resistance threshold, $R_{t2}$, the method may proceed to an optional step 110, in which it is determined that an additional QA step is needed to raise the energy capacity of the battery module. A low energy capacity of the battery module is a side effect when filling too much oxygen into the battery module and a QA step (including charging and discharging of the battery module) will increase the energy capacity with only minor effect on the internal resistance of the cells in the battery module. If QA is needed, step 111 is performed until the energy capacity of the battery module is OK.

The step of determining 109 may be replaced with a QA step, since the internal resistance is determined as part of the QA step.

It is possible that the control unit performs the step 101 of obtaining data on the battery pack differently depending on the length of the time that has elapsed from the last time the data was obtained. The data may be stored in a working memory of the control unit 14 for a short time.

Figure 4:
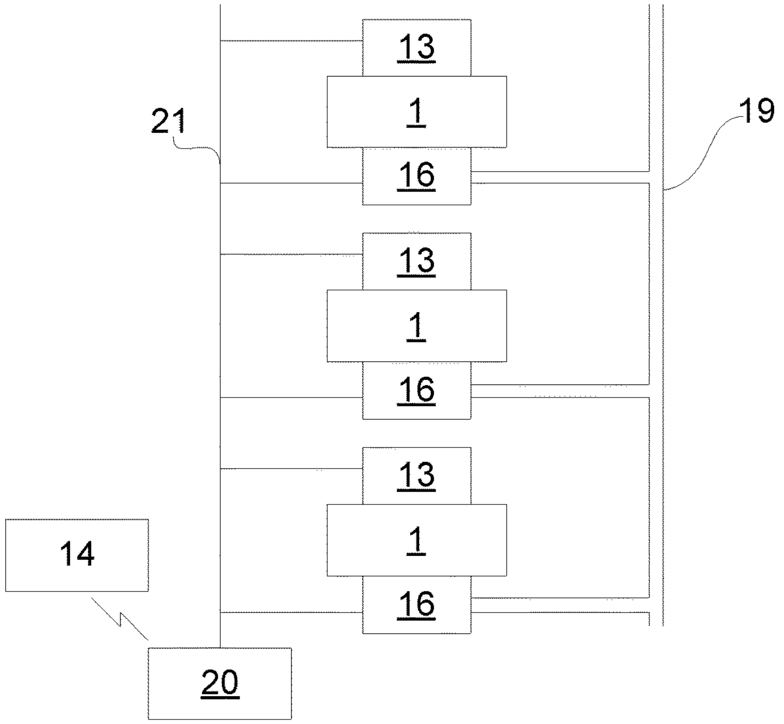
FIG. 4 illustrates how a number of battery modules may be configured in order to be monitored and reconditioned, according to a first alternative embodiment of the method.

FIG. 4 illustrates how a number of battery modules may be configured in order to be monitored and reconditioned according to a first alternative embodiment of the method. A number of battery modules 1 are connected to a respective measuring unit 13 and to a common gas line 19 via a respective inlet valve 16. All measuring units 13 and all inlet valves 16 are in communication with a local control unit 20 which controls all inlet valves 16 and is in communication with all measuring units 13 via the bus 21. The local control unit 20 may be in communication with a control unit 14 at a remote location. If it is determined that any battery module 1 is to be filled with gas the control unit 14 sends a control signal to the local control unit 20 which in turn controls the associated inlet valve 16 to be opened.

Figure 5:
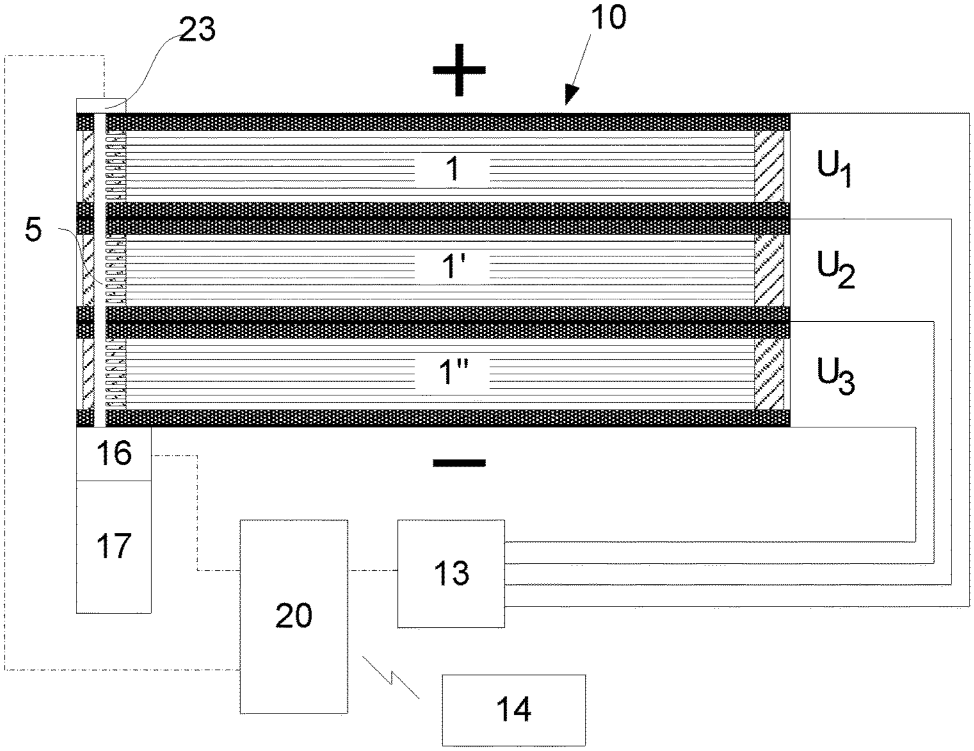
FIG. 5 illustrates how a battery pack comprising three battery modules may be configured to be monitored and reconditioned, according to a second alternative embodiment of the method.

FIG. 5 illustrates how a battery pack comprising a number of modules 1 may be configured to be monitored and reconditioned, according to a second alternative embodiment of the method. In FIG. 5 a number of battery modules, as disclosed in WO 2018/111182 assigned to the present applicant, are stacked together to form a battery pack 10. The battery modules 1, 1' and 1" in the battery pack 10 have a common gas space 5. The internal resistance may be obtained on each battery module separately. In case the average internal resistance per battery cell 2 in any one of the battery modules exceeds the first resistance threshold $R_{t1}$ gas may be filled into the common gas space 5 according to the method described in connection with FIG. 2.

The battery modules are connected to a common measuring unit 13 and to a gas container 17 via an inlet valve 16. The measuring unit 13 and the inlet valve 16 is in communication with a local control unit 20 which controls the inlet valve 16. The local control unit 20 may be in communication with a control unit 14 at a remote location. If it is determined that any battery module needs to be filled with gas the control unit 14 sends a control signal to the local control unit 20 which in turn controls the inlet valve 16 to be opened.

In the above description it has been described how a control unit 14 may perform the method. The control unit may comprise at least one processor 14' (FIG. 1). The processor may be programmed with a computer program comprising instructions which, when executed on the at least one processor, cause the at least one processor to carry out the method described above in connection with FIG. 2. The method at the control unit may be computer implemented.

EXAMPLE

Figure 6:
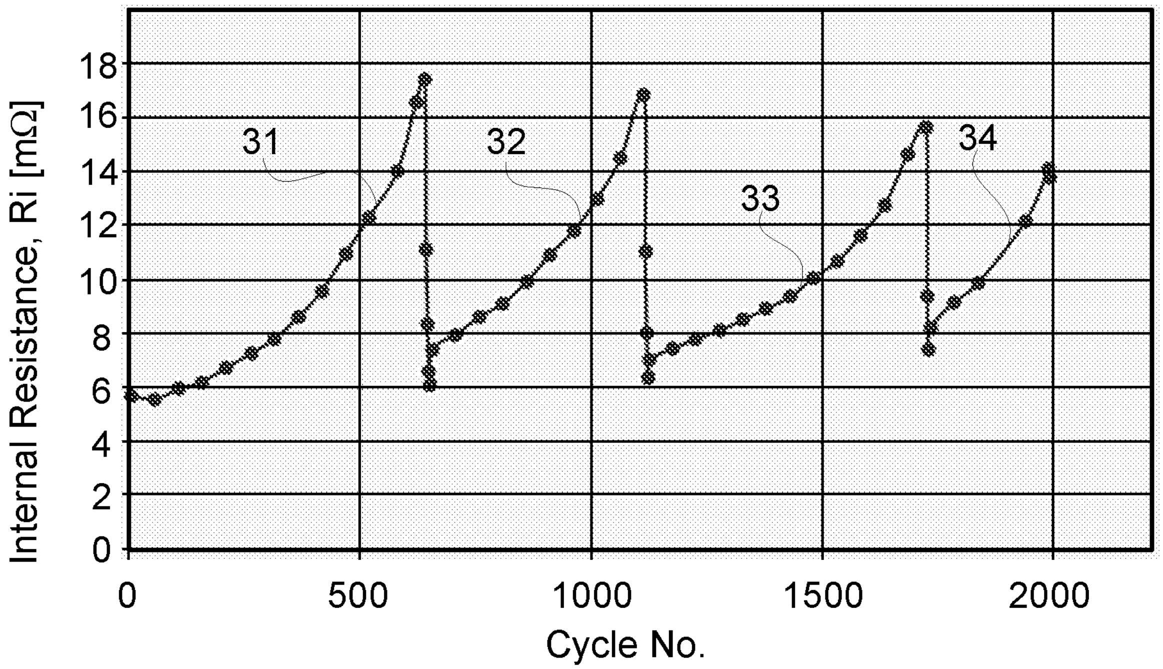
FIG. 6 illustrates an example of reconditioning of a battery module and illustrates how the internal resistance per battery cell varies with the number of cycles of discharge/charge.

FIG. 6 illustrates reconditioning of a battery module 1 and illustrates how the internal resistance per battery cell 2 varies with the number of cycles of discharge/charge. The following table comprises details on the reconditioning.

TABLE 1

| 12 V module | Internal Resistance per battery cell (mΩ) | 0.2 C Capacity(Ah) | Mid-Voltage(V) | 0.5 C Capacity(Ah) |
|---|---|---|---|---|
| R ratio 3.06 | | | | |
| 641 cycles | 17.417 | 10.764 | 12.231 | 10.342 |
| Add 3 liter O2 | 11.110 | 11.115 | 12.485 | 10.771 |
| Add 3 liter O2 | 8.333 | 11.277 | 12.598 | 10.963 |
| Add 3 liter O2 | 6.566 | 11.434 | 12.644 | 11.213 |
| Add 1.5 liter O2 | 6.060 | 11.490 | 12.674 | 11.300 |
| 475 cycles | 16.636 | 11.495 | 12.259 | 10.650 |
| R ratio 2.75 | | | | |
| Add 3 literO2 | 11.005 | 11.611 | 12.459 | 11.182 |
| Add 3 liter O2 | 8.006 | 11.186 | 12.585 | 10.96 |
| Repeat QA | 8.182 | 11.371 | 12.593 | 11.054 |
| Repeat QA | 8.269 | 11.503 | 12.613 | 11.113 |
| Add 3 liter O2 | 6.333 | 10.476 | 12.655 | 10.552 |
| 601 cycles | 15.636 | 11.128 | 12.230 | 10.536 |
| R ratio 2.47 | | | | |
| Add 3.29 liter O2 | 9.355 | 10.539 | 12.495 | 10.467 |
| Add 2.33 liter O2 | 7.397 | 9.582 | 12.585 | 9.594 |
| 263 cycles | 13.763 | 10.135 | 12.265 | 9.996 |

The term "R ratio" is a measure that reflects the increase of internal resistance from the initial value before cycling starts to the point when the internal resistance increases the first predetermined resistance threshold, e.g. 15 mΩ. In Table 1, the first R ratio is calculated to be 3.06, which means that the initial average internal resistance of the battery module was equal to: 17.417 mΩ/3.06=5.69 mΩ.

The first part 31 of the curve in FIG. 6 shows how the internal resistance per battery cell 2 changes with the number of charging/discharging cycles of the battery module 1. The internal resistance per battery cell 2 was 5.69 mΩ before the first charge discharge of the battery. After 641 cycles the internal resistance per battery cell 2 was 17.417 mΩ, thus the R ratio=3.06. Then, oxygen was added in steps in a first set of fillings and the internal resistance per battery cell 2 was measured after each filling. After a first filling with 3 liters of oxygen the internal resistance per battery cell 2 was 11.11 mΩ. After a second filling with 3 liters of oxygen the internal resistance per battery cell 2 was 8.333 mΩ. After a third filling with 3 liters of oxygen the internal resistance per battery cell 2 was 6.566 mΩ. Finally, after a fourth filling with 1.5 liters of oxygen the internal resistance per battery cell 2 was 6.06 mΩ.

The second part 32 of the curve in FIG. 6 shows how the internal resistance per battery cell 2 changed with the number of charging/discharging cycles of the battery module 1 after the first set of fillings. After 475 cycles the internal resistance per battery cell 2 was 16.636 mΩ, thus the R ratio=2.75. Then, oxygen was added in steps in a second set of fillings and the internal resistance per battery cell 2 was measured after each filling. After a first filling with 3 liters of oxygen the internal resistance per battery cell 2 was 11.005 mΩ. After a second filling with 3 liters of oxygen the internal resistance per battery cell 2 was 8.006 mΩ. The steps denoted repeat QA are steps of adjusting the discharge reserve to gain some more capacity in the battery module, which steps including charging and discharging of the battery module 1.

After a third filling with 3 liters of oxygen the internal resistance per battery cell 2 was 6.333 mΩ.

The third part 33 of the curve in FIG. 6 shows how the internal resistance per battery cell 2 changed with the number of charging/discharging cycles of the battery module 1 after the second set of fillings. After about 601 cycles the resistance per battery cell 2 was 15.636 mΩ, thus R ratio=2.47. Then oxygen was added in two steps in a third set of fillings and the internal resistance was measured after each filling. After a first filling with 3.29 liters of oxygen the internal resistance per battery cell 2 was 10.539 mΩ. After a second filling with 2.33 liters of oxygen the internal resistance per battery cell 2 was 7.397 mΩ.

After completing the third set of fillings, the battery module was cycled and a fourth part 34 of the curve in FIG. 6 indicate the status of the internal resistance per battery cell at 263 cycles and the battery module is still under cycling.

The present disclose relates to a method for reconditioning of a battery module 1 comprising two or more battery cells 2, the battery module having a casing 4 encompassing the battery cells and enclosing a common gas space 5. Each battery cell 2 in the battery module 1 comprises a first electrode, a second electrode, a porous separator, and an aqueous alkaline electrolyte arranged between the first electrode and the second electrode. The porous separator, the first electrode and the second electrode are configured to allow exchange of hydrogen and oxygen by allowing gas to migrate between the electrodes, and the casing 4 further comprises an inlet 25 for adding a gas or a liquid to the common gas space 5 of the casing 4. The method comprises the steps of obtaining 101 data on the battery module 1, wherein the data relates to the number of battery cells of the battery module 1, the temperature of the battery module 1, and the energy capacity of the battery module 1; obtaining 102 an indicative parameter related to an internal resistance $R_i$ of at least one of the battery cells 2; determining 104, in case the indicative parameter exceeds a predetermined first threshold value, based on the indicative parameter and the obtained data on the battery module, a filling amount of oxygen to be filled into the battery cells of the battery module 1; obtaining 105 a voltage indication at the measured temperature, e.g. OCV or SOC, over the at least one of the battery cells $U_c$; determining 105*a* whether the voltage indication over the at least one of the battery cells exceeds a predetermined upper voltage indication threshold $U_{t1}$, (e.g. OCV at 1.39 V/cell measured at a temperature of +20° C.±2° C. or 95% SOC) and when the obtained voltage indication over the at least one of the battery cells $U_c$ is lower than the predetermined upper voltage indication threshold $U_{t1}$, initiating filling 107 of the amount of oxygen into the battery module 1 in order to reduce the indicative parameter to a level below the first threshold value; obtaining 105 a voltage indication at the measured temperature, e.g. OCV or SOC, over the at least one of the battery cells $U_c$; determining 105*a* whether the voltage indication over the at least one of the battery cells is under a predetermined lower voltage indication threshold Ut0 (e.g. OCV at 1.3V/cell measured at a temperature of +20° C.±2° C. or 50% SOC) and when the obtained voltage indication over the at least one of the battery cells $U_c$ is above the predetermined lower voltage indication threshold Ut0 initiating filling 107 of the amount of oxygen into the battery module 1 in order to reduce the indicative parameter to a level below the first threshold value.

According to some embodiments, the indicative parameter is selected to be the internal resistance $R_i$ of at least one of the battery cells 2. The first threshold value is a first resistance threshold $R_{t1}$, and the filling of oxygen into the battery module 1 reduces the internal resistance of the at least one of the battery cells to a level below the first resistance threshold $R_{t1}$.

According to some embodiment, the indicative parameter is related to state of health, SOH, of the battery module.

According to some embodiment, the upper voltage indication threshold $U_{t1}$ is a function of the indicative parameter related to the internal resistance $R_i$ of said at least one of the battery cells.

According to some embodiment, the method further comprises, when the obtained voltage indication over the at least one of the battery cells $U_c$ is higher or equal to the predetermined upper voltage indication threshold $U_{t1}$, the step of discharging 106*a* the battery module to reduce the voltage of said at least one of the battery cells to a voltage indication below the upper voltage indication threshold $U_{t1}$, before performing the step of initiating filling 107 of the battery module with the determined filling amount of oxygen.

According to some embodiment, the method further comprising the steps of determining 105*a* whether the voltage indication at the measured temperature over the at least one of the battery cells is lower or equal than a predetermined lower voltage indication threshold, $U_{t0}$ (e.g. OCV at 1.3V/cell measured at a temperature of +20° C.±2° C. or 50% SOC), and performing the step of initiating filling 107 when the obtained voltage indication over the at least one of the battery cells $U_c$ exceeds the predetermined lower voltage indication threshold $U_{t0}$.

According to some embodiment, the method further comprising, when the obtained voltage indication at the measured temperature over the at least one of the battery cells $U_c$ is lower or equal to the predetermined lower voltage indication threshold $U_{t0}$, the step of charging 106*b* the battery module to increase the voltage of said at least one of the battery cells to a voltage indication above the lower voltage indication threshold $U_{t0}$, before performing the step of initiating filling 107 of the battery module with the determined filling amount of oxygen.

According to some embodiment, the step of initiating filling 107 further comprises filling the battery module with hydrogen prior to filling the battery module with oxygen. This step is performed only when it is safe to fill the battery with oxygen.

According to some embodiment, the voltage indication is selected to be an open circuit voltage over the at least one of the battery cells, and the upper and lower voltage indication threshold are temperature dependent.

According to some embodiment, the voltage indication is related to State of Charge, SOC, of the battery module.

According to some embodiment, the step of initiating filling 107 of the battery module 1 further comprises filling the battery module with an inert gas in conjunction with filling of the battery module with oxygen.

According to some embodiment, the inert gas is selected to be any combination of: Argon, Nitrogen, Helium and/or air.

According to some embodiment, the step of initiating filling 107 further comprising the step of initiating the preparation of a container 17 with the determined filling amount of oxygen to reduce the indicative parameter of the at least one of the battery cells of the battery module.

According to some embodiment, the method further comprising, after filling of the battery module 1 with the amount of oxygen, the steps of obtaining 108 an after filling parameter related to the internal resistance $R_i$ after filling of the battery module; determining 109 whether the after filling parameter exceeds a predetermined second threshold value, wherein the second threshold value is lower than the first threshold value; determining, in case the after filling parameter exceeds the predetermined second threshold value, an additional filling amount of oxygen to be filled into the battery module 1, based on the after filling parameter and the data on the battery module 1, in order to reduce the after filling parameter below the second threshold value; and filling of the battery module 1 with the determined additional filling amount of oxygen.

According to some embodiment, the battery module is selected to be a nickel metal hydride, NiMH, battery module.

The present disclosure also relates to a computer program for reconditioning a battery module, comprising instructions which, when executed on at least one processor 14', cause the at least one processor 14' to carry out the method described above. The present disclosure also relates to a computer-readable storage medium carrying the computer program for reconditioning a battery module.

The present disclosure also relates to a container 17 for reconditioning a battery module 1, wherein the container is filled with at least a filling amount of oxygen to reduce the indicative parameter related to the internal resistance of at least one of the battery cells in a battery module 1, the filling amount of oxygen is determined according to the method described above. As described above the pressure of the gas in the container depends on the volume of the container and the amount of gas in the container. For a small container the container amount is approximately the same as the filling amount of oxygen. However, after filling of oxygen from a container a residual amount of oxygen will always remain in the container. The flow of gas from the container to the battery module will continue until the pressure in the container is the same as the pressure in the common gas space of the battery module. Thus, the container amount of gas must be slightly larger than the filling amount.

The present disclosure also relates to a system 50 for reconditioning a battery module 1 comprising two or more battery cells 2, the battery module having a casing 4 encompassing the battery cells and enclosing a common gas space 5. Each battery cell 2 in the battery module 1 comprises a first electrode, a second electrode, a porous separator, and an aqueous alkaline electrolyte arranged between the first electrode and the second electrode, and the porous separator, the first electrode and the second electrode are configured to allow exchange of hydrogen and oxygen by allowing gas to migrate between the electrodes. The casing 4 further comprises an inlet 25 for adding a gas or a liquid to the common gas space 5 of the casing 4. The system comprises a control circuitry 14, 20 configured to perform the method described above.

According to some embodiment, the system further comprising a measuring unit 13 configured to obtain parameters (such as voltage, internal pressure, temperature) used to determine the indicative parameter related to the internal resistance of the battery module 1, said measuring unit 13 is configured to communicate with the control circuitry 14, 20.

According to some embodiment, the control circuitry comprises: a local control unit 20 configured to obtain at least the indicative parameter related to the internal resistance of at least one of the battery cells 2 and to control the filling of oxygen into the battery module 1; and a control unit 14, which is in communication with the local control unit 20, the control unit is configured to obtain data on the battery module from a memory 26 and to determine the filling amount of oxygen based on the indicative parameter obtained from the local control unit 20 and the data on the battery module 1.

Aspects of the disclosure are described with reference to the drawings, e.g., block diagrams and/or flowcharts. It is understood that several entities in the drawings, e.g., blocks of the block diagrams, and also combinations of entities in the drawings, can be implemented by computer program instructions, which instructions can be stored in a computer-readable memory, and also loaded onto a computer or other programmable data processing apparatus. Such computer program instructions can be provided to a processor of a general purpose computer, a special purpose computer and/or other programmable data processing apparatus to produce a machine, such that the instructions, which execute via the processor of the computer and/or other programmable data processing apparatus, create means for implementing the functions/acts specified in the block diagrams and/or flowchart block or blocks.

In some implementations and according to some aspects of the disclosure, the functions or steps noted in the blocks can occur out of the order noted in the operational illustrations. For example, two blocks shown in succession can in fact be executed substantially concurrently or the blocks can sometimes be executed in the reverse order, depending upon the functionality/acts involved. Also, the functions or steps noted in the blocks can according to some aspects of the disclosure be executed continuously in a loop.

In the drawings and specification, there have been disclosed exemplary aspects of the disclosure. However, many variations and modifications can be made to these aspects without substantially departing from the principles of the present disclosure. Thus, the disclosure should be regarded as illustrative rather than restrictive, and not as being limited to the particular aspects discussed above. Accordingly, although specific terms are employed, they are used in a generic and descriptive sense only and not for purposes of limitation.

The invention claimed is:

1. A method for reconditioning of a battery module having two or more battery cells, the battery module having a casing encompassing the battery cells and enclosing a common gas space, wherein each battery cell in the battery module has a first electrode, a second electrode, a porous separator, and an aqueous alkaline electrolyte arranged between the first electrode and the second electrode, wherein the porous separator, the first electrode and the second electrode are configured to allow exchange of hydrogen and oxygen by allowing gas to migrate between the electrodes, and wherein the casing has an inlet for adding a gas or a liquid to the common gas space of the casing; the method comprising:

obtaining data on the battery module, wherein the data relates to the number of battery cells of the battery module, the temperature of the battery module, and the energy capacity of the battery module;

obtaining an internal resistance ($R_i$) of at least one of the battery cells;

determining, in case the internal resistance exceeds a predetermined first resistance threshold ($R_{t1}$), based on the internal resistance and the obtained data on the battery module, a filling amount of oxygen to be filled into the battery cells of the battery module;

obtaining a voltage indication, which is an open circuit voltage over the at least one of the battery cells ($U_c$);

determining whether the voltage indication over the at least one of the battery cells exceeds a predetermined upper voltage indication threshold ($U_t$), and when the obtained voltage indication over the at least one of the battery cells ($U_c$) is lower than the predetermined upper voltage indication threshold ($U_{t1}$), initiating filling of the amount of oxygen into the battery module in order to reduce the internal resistance to a level below the first resistance threshold ($R_{t1}$);

determining whether the voltage indication over the at least one of the battery cells is under a predetermined lower voltage indication threshold ($U_{t0}$), and when the obtained voltage indication over the at least one of the battery cells ($U_c$) is above the predetermined lower voltage indication threshold ($U_{t0}$), initiating filling of the amount of oxygen into the battery module in order to reduce the internal resistance to a level below the first resistance threshold ($R_{t1}$).

2. The method according to claim 1, wherein the upper voltage indication threshold ($U_{t1}$) is a function of the internal resistance ($R_i$) of the at least one of the battery cells.

3. The method according to claim 1, further comprising, when the obtained voltage indication over the at least one of the battery cells ($U_c$) is higher than or equal to the predetermined upper voltage indication threshold ($U_t$), discharging the battery module to reduce the voltage of the at least one of the battery cells to a level below the upper voltage indication threshold ($U_{t1}$), before initiating filling of the battery module with the determined filling amount of oxygen.

4. The method according to claim 1, further comprising, when the obtained voltage indication over the at least one of the battery cells ($U_c$) is lower or equal to the predetermined lower voltage indication threshold ($U_{t0}$), charging the battery module to increase the voltage of the at least one of the battery cells to a level above the lower voltage indication threshold ($U_{t0}$), before initiating filling of the battery module with the determined filling amount of oxygen.

5. The method according to claim 1, wherein the initiating filling further comprises filling the battery module with hydrogen prior to filling the battery module with oxygen.

6. The method according to claim 1, wherein the upper and the lower voltage indication thresholds are temperature dependent.

7. The method according to claim 1, wherein the initiating filling of the battery module further comprises:

filling the battery module with an inert gas in conjunction with filling of the battery module with oxygen.

8. The method according to claim 7, wherein the inert gas is selected to be any combination of: Argon, Nitrogen, Helium and/or air.

9. The method according to claim 1, wherein the initiating filling comprises initiating the preparation of a container with the determined filling amount of oxygen to reduce the indicative parameter of the at least one of the battery cells of the battery module.

10. The method according to claim 1, further comprising, after filling of the battery module with the amount of oxygen, obtaining the internal resistance ($R_i$) after filling of the battery module;

determining whether the internal resistance after filling exceeds a predetermined second resistance threshold, wherein the second resistance threshold is lower than the first resistance threshold;

determining, in case the internal resistance after filling exceeds the predetermined second resistance threshold, an additional filling amount of oxygen to be filled into the battery module, based on the internal resistance after filling and the data on the battery module, in order to reduce the internal resistance after filling to a level below the second resistance threshold; and filling of the battery module with the determined additional filling amount of oxygen.

11. The method according to claim 1, wherein the battery module is selected to be a nickel metal hydride, NiMH, battery module.

12. A computer program for reconditioning a battery module, comprising instructions which, when executed on at least one processor, cause the at least one processor to carry out the method according to claim 1.

13. A computer-readable storage medium carrying a computer program for reconditioning a battery module according to claim 12.

14. A system for reconditioning a battery module having two or more battery cells, the battery module having a casing encompassing the battery cells and enclosing a common gas space, wherein each battery cell in the battery module has a first electrode, a second electrode, a porous separator, and an aqueous alkaline electrolyte arranged between the first electrode and the second electrode, wherein the porous separator, the first electrode and the second electrode are configured to allow exchange of hydrogen and oxygen by allowing gas to migrate between the electrodes, and wherein the casing has an inlet for adding a gas or a liquid to the common gas space of the casing; the system comprising:

a control circuitry configured to perform the method according to claim 1; and a measuring unit configured to obtain the internal resistance of the battery module, the measuring unit being configured to communicate with the control circuitry.

15. The system according to claim 14, wherein the control circuitry comprises:

a local control unit configured to obtain at least the internal resistance of at least one of the battery cells and to control the filling of oxygen into the battery module; and a control unit, which is in communication with the local control unit, the control unit being configured to obtain data on the battery module from a memory and to determine the filling amount of oxygen based on the internal resistance obtained from the local control unit and the data on the battery module.

* * * * *